United States Patent
Senzaki et al.

(10) Patent No.: US 6,503,561 B1
(45) Date of Patent: *Jan. 7, 2003

(54) LIQUID PRECURSOR MIXTURES FOR DEPOSITION OF MULTICOMPONENT METAL CONTAINING MATERIALS

(75) Inventors: Yoshihide Senzaki, Carlsbad, CA (US); David Allen Roberts, Encinitas, CA (US); John Anthony Thomas Norman, Encinitas, CA (US); Arthur Kenneth Hochberg, Solana Beach, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/546,452

(22) Filed: Apr. 10, 2000

Related U.S. Application Data

(63) Continuation-in-part of application No. 09/350,074, filed on Jul. 8, 1999, now Pat. No. 6,238,734.

(51) Int. Cl.$^7$ .............................................. C23C 16/18
(52) U.S. Cl. ..................... 427/226; 427/229; 427/240; 427/244; 427/255.31; 427/255.32; 427/255.394
(58) Field of Search .............................. 427/124, 126.1, 427/226, 229, 240, 244, 255.31, 255.32, 255.394

(56) References Cited

U.S. PATENT DOCUMENTS

| | | | |
|---|---|---|---|
| 4,058,430 A | 11/1977 | Suntola et al. | 156/611 |
| 5,204,314 A | 4/1993 | Kirlin et al. | 505/1 |
| 5,820,664 A | 10/1998 | Gardiner et al. | 106/287.17 |
| 6,015,917 A * | 1/2000 | Bhandari et al. | |
| 6,238,734 B1 * | 5/2001 | Senzaki et al. | |

FOREIGN PATENT DOCUMENTS

WO    WO98/46617    10/1998

OTHER PUBLICATIONS

Gordon, Roy G.; Barry, Sean T.;, et al. "Liquid Compounds for CVD of Alkaline Earth Metals" Abstract, MRS Meeting, San Francisco, Apr. 7, 1999.

Gordon, Roy G.,. et al. "New Liquid Precursors for Chemical Vapor Deposition" Fall 1997 MRS Meeting Symposium W, paper 7.3.

Guglielmi, M. et al. "Compositional and Microstructural Characterization of RuO2–TiO2 Catalysts Synthesized by the Sol–Gel Method", Electrochem. Soc., vol. 139, No. 6, Jun. 1992.

Cava, R. F., et al., "Enhancement of the Dielectric Constant of $Ta_2O_5$ through Substitution with $TiO_2$", Letters to Nature, vol. 377, Sep. 21, 1995.

Schulz, Douglas L. and Tobin J. Marks, "MOCVD Routes to Thin Metal Oxide Films for Superconducting Electronics" Adv. Mater. 1994, 6, No. 10.

Sun, X., et al. "Reactively Sputtered Ti–SiN Films. II. Diffusion barriers for AL and Cu metalization on Si" J. Appl. Phys. 81 (2), Jan. 15, 1997.

Van Dover, R. B., et al. "Investigation of Ternary Transition–Metal Nitride Systems by Reactive Cosputtering" Chem. Mater. 1993, 5, 32–35.

Hara, Nobuyoshi, et al., "Formation of Al2O3–Ta2O5 Double Oxide Thin Films by Low–Pressure MOCVD and Evaluation of Their Corrosion Resistances in Acid and Alkali Solutions" Journal of Electrochemical Society, 146 (2) 510–516 (1999).

Sheppard, Laurel M., "Advances in Processing of Ferroelectric Thin Films" Ceramic Bulletin, Vo. 71, No. 1 1992.

* cited by examiner

Primary Examiner—Timothy Meeks
(74) Attorney, Agent, or Firm—Geoffrey L. Chase

(57) ABSTRACT

The present invention is a composition for deposition of a mixed metal or metal compound layer, comprising a solventless mixture of at least two metal-ligand complex precursors, wherein the mixture is liquid at ambient conditions and the ligands are the same and are selected from the group consisting of alkyls, alkoxides, halides, hydrides, amides, imides, azides cyclopentadienyls, carbonyls, and their fluorine, oxygen and nitrogen substituted analogs. The present invention is also a process for deposition of a multiple metal or metal compound layer on a substrate of an electronic material, comprising: a) providing a solventless mixture of two or more metal-ligand complex precursors which constitute a liquid at ambient conditions, wherein the ligands are the same and are selected from the group consisting of alkyls, alkoxides, halides, hydrides, amides, imides, azides, nitrates, cyclopentadienyls, carbonyls, pyrazoles, and their fluorine, oxygen and nitrogen substituted analogs; b) delivering the solventless mixture by direct liquid injection to a flash vaporization zone to vaporize the solventless mixture; c) contacting the substrate under deposition conditions with a resulting vapor of the solventless mixture, and c) depositing a multiple metal or metal compound layer on the substrate from the solventless mixture.

23 Claims, No Drawings

LIQUID PRECURSOR MIXTURES FOR DEPOSITION OF MULTICOMPONENT METAL CONTAINING MATERIALS

CROSS-REFERENCE TO RELATED APPLICATIONS

This is a continuation-in-part of U.S. patent application Ser. No. 09/350,074 filed Jul. 8, 1999 now U.S. Pat. No. 6,238,734.

STATEMENT REGARDING FEDERALLY SPONSORED RESEARCH OR DEVELOPMENT

Not applicable.

BACKGROUND OF THE INVENTION

The semiconductor fabrication industry requires materials and deposition technology adequate to deposit metals, metal mixtures and metal compound mixtures in thin layers, plugs, vias and patterns on semiconductor and insulating or dielectric substrates to make appropriate electrical devices for integrated circuits, memory devices and flat panel display devices.

Various techniques are known for depositing metals, metal compounds and their mixtures on appropriate electronic materials substrates, including; physical methods (sputtering, molecular beam epitaxy, evaporation and laser ablation), alloying, and chemical vapor deposition (plasma, photo, radical or laser enhanced, low pressure and high temperature).

Various multiple metal oxides are known in the literature, including those recited in: "Advances in Processing of Ferroelectric Thin Films", L. M. Sheppard, Ceramic Bulletin, Vol. 71, No. 1, (1992), pp. 85–95; "Formation of $Al_2O_3$—$Ta_2O_5$ Double-Oxide Thin Films by Low-Pressure MOCVD and Evaluation of Their Corrosion Resistances in Acid and Alkali Solutions", Hara, et. al., Journal of the Electrochemical Society, 146 (2) (1999), pp. 510–516; "High Coercivity in $Sm_2Fe_{17}N_x$ Magnets", Schnitzke, et. al., Appl. Phys. Left. 57 (26) Dec. 24, 1990, pp. 2853–2855; "Investigation of Ternary Transition-Metal Nitride Systems by Reactive Cosputtering", Van Dover, et. al., Chem. Mater. (1993), Vol. 5, pp. 32–35; "Reactively Sputtered Ti—Si—N Films II. Diffusion Barriers for Al and Cu Metallizations on Si", Sun, et. al., J. Appl. Phys., 81 (2) Jan. 15, 1997, pp. 664–671; "MOCVD Routes to Thin Metal Oxide Films for Superconducting Electronics", Schulz, et. al., Adv. Mater. (1994), 6 No. 10, pp. 719–730; "Compositional and Microstructural Characterization of $RuO_2$—$TiO_2$ Catalysts Synthesized by the Sol-Gel Methods", Guglielmi, et. al., J. Electrochem. Soc., Vol. 139, No. Jun. 6, 1992, pp. 1665–1661; "Enhancement of the Dielectric Constant of $Ta_2O_5$ Through Substitution with $TiO_2$", Cava, et. al., Nature, Vol. 377, Sep. 21, 1995, pp. 215–217; and U.S. Pat. No. 4,058,430, the latter of which also discloses the deposition process known as "atomic layer epitaxy".

Chemical vapor deposition (CVD) has gained favor in recent years due to its properties of providing uniform and conformal deposition and its ability to deposit an array of materials under highly controllable conditions. Typically, chemical vapor deposition can provide high deposition rates of high purity materials in a controlled fashion.

However, chemical vapor deposition has several drawbacks which make its implementation challenging. Not all desired chemicals are sufficiently volatile to make themselves amenable to chemical vapor deposition. Some chemicals are solids at storage or delivery conditions. Some chemicals are too volatile for adequate storage and delivery.

The situation for chemical vapor deposition is further complicated by the need to co-deposit several chemicals such as in multiple metal chemical vapor deposition, such as multiple metal oxide chemical vapor deposition. It is possible for metal precursors to react with one another or for at least one metal precursor for CVD to be too volatile or too involatile, i.e., a solid.

To overcome these disadvantages of CVD, the prior art has used solvents to dissolve solid metal precursors or blend liquid, particularly viscous liquid, metal precursors for CVD.

U.S. Pat. No. 5,204,314 discloses a foraminous device for flash vaporization of liquid mixtures or solvent mixtures of metal precursors for CVD.

U.S. Pat. No. 5,820,664 describes various solvent mixtures of mixed metal compound precursors, which are useful for CVD.

However, solvent systems for liquid delivery for CVD are problematic because compatible, volatile solvents must be chosen. Solvents decrease the amount of effective reagent that is delivered for a given flow and time period. More importantly, solvents introduce yet another reagent into the sensitive reaction zone where delicate semiconductor and electronic device fabrication is being performed. The adverse effects of such solvent presence must be considered. Finally, solvents represent an environmental and cost factor. The solvent or its degradation products must be recycled, captured or treated subsequent to utilization.

International Patent Application WO98/46617 describes metal precursors and processes for deposition of metals from mixed β-diketonates. The application addresses liquid delivery of metal precursors for CVD and other depositions by direct liquid injection. Using mixed β-diketonates enhances the liquid state of the precursors to facilitate delivery. Solvents are an option for the liquid mixtures.

Similar disclosures appeared in "New Liquid Precursors for Chemical Vapor Deposition", Gordon, et. al., Mater. Res. Soc. Symp. Proc., 495, (1998), pp. 63–68; and "Liquid Compounds for CVD of Alkaline Earth Metals", Gordon, et. al., MRS Meeting, Apr. 7, 1999, San Francisco, Calif.

The prior art attempts to provide appropriate liquid media for metal precursor delivery have required the use of selected solvents or mixed β-diketonate ligands to assure liquid conditions for delivery. Solvents constitute problems of contamination and abatement. Mixed ligands constitute problems of inadvertent ligand exchange which can lead to non-liquid conditions. The β-diketonate ligands frequently lead to solid metal compounds absent manipulation of the β-diketonate substituents to avoid conditions leading to solid conditions, thus aggravating the consequences of inadvertant ligand exchange. The present invention overcomes these drawbacks by using a solventless, common ligand mixture of metals in a liquid state for deposition preferably by direct liquid injection to avoid solvent and ligand exchange drawbacks for consistent deposition performance.

BRIEF SUMMARY OF THE INVENTION

The present invention is a process for deposition of a multiple metal or metal compound layer on a substrate of an electronic material, comprising:

a) providing a solventless mixture of two or more metal-ligand complex precursors which constitute a liquid at ambient conditions, wherein the ligands are the same and are selected from the group consisting of alkyls, alkoxides, halides, hydrides, amides, imides, azides, nitrates, cyclopentadienyls, carbonyls, pyrazoles, and their fluorine, oxygen and nitrogen substituted analogs;

b) delivering the solventless mixture to a deposition zone where the substrate is located;

c) contacting the substrate under deposition conditions with the solventless mixture, where the contacting under deposition conditions is selected from the group consisting of chemical vapor deposition, spray pyrolysis, sol-gel processing, spin coating, and atomic layer deposition, and d) depositing a multiple metal or metal compound layer on the substrate from the solventless mixture.

The present invention is more preferably a process for deposition of a multiple metal or metal compound layer on a substrate of an electronic material, comprising:

a) providing a solventless mixture of two or more metal-ligand complex precursors which constitute a liquid at ambient conditions, wherein the ligands of the precursors are the same and are selected from the group consisting of alkyls, alkoxides, halides, hydrides, amides, imides, azides, nitrates, cyclopentadienyls, carbonyls, pyrazoles, and their fluorine, oxygen and nitrogen substituted analogs;

b) delivering the solventless mixture by direct liquid injection to a flash vaporization zone to vaporize the solventless mixture;

c) contacting the substrate under deposition conditions with a resulting vapor of the solventless mixture, and d) depositing a multiple metal or metal compound layer on the substrate from the solventless mixture.

Preferably, the ambient conditions are less than or equal to 40° C. and less than or equal to 30 psig.

More preferably, the ambient conditions are 20–30° C. and 5–6 psig.

Preferably, the solventless mixture is mixed with a source of oxygen prior to depositing the multiple metal compound layer on the substrate.

Preferably, the source of oxygen is selected from the group consisting of oxygen, ozone, nitrous oxide, nitric oxide, nitrogen dioxide, water, hydrogen peroxide, air and mixtures thereof.

Alternately, the solventless mixture is mixed with a source of nitrogen prior to depositing the multiple metal compound layer on the substrate. Alternately, the solventless mixture is mixed with a source of nitrogen and oxygen to deposit mixed-metal oxynitides prior to depositing the multiple metal compound layer on the substrate.

Preferably, the source of nitrogen is selected from the group consisting of nitrogen, ammonia, hydrazine, alkylhydrazine, hydrogen azide, alkylamine and mixtures thereof.

Preferably, the deposition process for producing a multiple metal or metal compound layer on the substrate from the solventless mixture is selected from the group consisting of chemical vapor deposition, spray pyrolysis, sol-gel processing, spin coating, and atomic layer deposition.

Preferably, the multiple metal or metal compound layer is selected from the group consisting of mixed metal alloys, mixed metal oxides, mixed metal nitrides, mixed metal oxynitrides, mixed metal carbides, mixed metal carbonitrides, mixed metal oxycarbonitrides, mixed metal oxycarbides, mixed metal borides, mixed metal sulfides, mixed metal phosphides, mixed metal arsenides, mixed metal antimonides, mixed metal selenides, mixed metal tellurides and mixtures thereof.

The present invention is also a composition for deposition of a mixed metal or metal compound layer, comprising a solventless mixture of at least two metal-ligand complex precursors, wherein the mixture is liquid at ambient conditions and the ligands of the precursors are the same and are selected from the group consisting of alkyls, alkoxides, halides, hydrides, amides, imides, azides, nitrates, cyclopentadienyls, carbonyls, pyrazoles, and their fluorine, oxygen and nitrogen substituted analogs.

Preferably, the mixture contains a first metal-ligand complex precursor which is liquid at ambient conditions and a second metal-ligand complex precursor which is liquid at ambient conditions.

Alternately, the mixture contains a first metal-ligand complex precursor which is liquid at ambient conditions and a second metal-ligand complex precursor which is solid at ambient conditions, but which is miscible in the first metal-ligand complex precursor.

Preferably, the metals of the solventless mixture of at least two metal-ligand complex precursors are individually selected from the group consisting of zinc, cadmium, mercury, aluminum, germanium, gallium, indium, thallium, tin, lead, antimony, bismuth, lithium, sodium, potassium, rubidium, cesium, beryllium, magnesium, calcium, strontium, barium, scandium, yttrium, lanthanum, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, silicon and cerium.

Preferably, the ligand of the solventless mixture of at least two metal-ligand complex precursors is selected from the group consisting of dimethyl amido, diethyl amido, ethylmethyl amido, butyl amido, dipropyl amido, methylpropyl amido, ethylpropyl amido, methoxy, ethoxy, propoxy, and butoxy.

Preferably, the solventless mixture of at least two metal-ligand complex precursors comprises $Zr(N(CH_2CH_3)_2)_4$, $Sn(N(CH_2CH_3)_2)_4$ and $Ti(N(CH_2CH_3)_2)_4$.

Alternately, the solventless mixture of at least two metal-ligand complex precursors comprises $Zr(N(CH_3)_2)_4$, $Sn(N(CH_3)_2)_4$ and $Ti(N(CH_3)_2)_4$.

Further alternately, the solventless mixture of at least two metal-ligand complex precursors comprises $Zr(O(C_4H_9))_4$, $Sn(O(C_4H_9))_4$ and $Ti(O(C_4H_9))_4$.

Further alternatively, the solventless mixture of at least two metal-ligand complex precursors comprises $Ta(N(CH_3)_2)_5$ and $Ti(N(CH_3)_2)_4$.

Further alternatively, the solventless mixture of at least two metal-ligand complex precursors comprises $CH_3CH_2N=Ta(N(CH_2CH_3)_2)_3$ and $Ti(N(CH_2CH_3)_2)_4$.

Further alternatively, the solventless mixture of at least two metal-ligand complex precursors comprises $Al(OCH_2CH_3)_3$ and $Ta(OCH_2CH_3)_5$.

Preferably, the solventless mixture of at least two metal-ligand complex precursors comprises $Si(N(CH_2CH_3)_2)$ and a metal-ligand complex precursor selected from the group consisting of $Ti(N(CH_2CH_3)_2)_4$, $Zr(N(CH_2CH_3)_2)_4$, $Hf(N(CH_2CH_3)_2)_4$, $V(N(CH_2CH_3)_2)_5$, $V(N(CH_2CH_3)_2)_4$, $Nb(N(CH_2CH_3)_2)_5$, $Nb(N(CH_2CH_3)_2)_4$, $CH_3CH_2N=Nb(N(CH_2CH_3)_2)_3$, $CH_3CH_2N=V(N(CH_2CH_3)_2)_3$, $(CH_3CH_2N=)_2W(N(CH_2CH_3)_2)_2$, $(CH_3CH_2N=)_2Mo(N(CH_2CH_3)_2)_2$, and $CH_3CH_2N=Ta(N(CH_2CH_3)_2)_3$.

BRIEF DESCRIPTION OF SEVERAL VIEWS OF THE DRAWINGS

Not Applicable

DETAILED DESCRIPTION OF THE INVENTION

Multicomponent metal containing materials, such as mixed-metal oxides and nitrides often have unique physical properties that each individual metal oxide/nitride component does not possess. For example, some mixed metal oxides can be used for high dielectric constant materials, ferroelectrics, high temperature superconductors, catalysts, and corrosion resistant coatings. Also, some mixed metal nitrides show good diffusion barrier properties, superconducting, and magnetic properties.

In the electronics industry, as the size of integrated circuit (IC) devices becomes aggressively smaller, thin films deposited by chemical vapor deposition (CVD) demonstrate an advantage over physical vapor deposition (PVD) methods in terms of conformal coverage on various non-planar surfaces. In general, liquid precursors are preferred for CVD applications due to the ease and reproducibility in precursor delivery. Common precursor delivery methods used in CVD processing include vapor draw, bubbling with carrier gas, mist droplet (aerosol or spray) delivery, and direct liquid injection (DLI). DLI is particularly a preferred method for the delivery of multi-components because it delivers the same ratio of constituents to the reactor as are in the source container. DLI has the added advantage of storing the precursor at room temperature and heating only the amount required to be delivered, and therefore, improving precursor shelf life.

In the present invention, new liquid precursor mixture compositions are disclosed that can be used for precursor dispersing delivery methods, including DLI in CVD applications. The volatile components are chosen such that:

1) They are chemically compatible, therefore, no non-volatile polymeric or multinuclear species are formed;
2) No precipitates are generated due to ligand exchange on the metals or inter ligand reactions, i.e., the same ligand is used for all precursors (i.e., homoleptic, for the present invention, (RN)=M shall be deemed to be the same as $M(NR_2)$;
3) The mixtures maintain low viscosity and thermal stability; and
4) Undesired redox chemistry will not take place (eg. $M^{+1}+M'^{+3} \rightarrow M^{+2}+M'^{+2}$).

Liquid mixtures can be prepared either by directly mixing liquid metal-ligand complexes or dissolving solid metal-ligand complex(es) in liquid metal-ligand complex(es). In these systems, no solvent is needed or desired to dissolve or dilute the precursor mixtures to achieve a total liquid phase of the resulting mixtures. A broad range of CVD precursor solutions using organic solvents have previously been used as precursors for thin film depositions. The present invention's new solventless precursor mixtures lower the burden of abatement of the CVD effluent in the exhaust, because there is no extra volatile organic medium to be collected after the CVD processing. In addition, since no solvent is used in the liquid mixtures described herein, high throughput of metal containing vapor can be delivered into the CVD reactor. Thus, the overall CVD process using these new liquid precursor mixtures is more environmentally benign and cost effective than liquid injection delivery of precursor solutions stated in the prior art. In addition to CVD or MOCVD (metal-organic CVD), the liquid mixtures of the present invention are amenable to atomic layer deposition, spin coating, spray pyrolysis and sol-gel processes. In atomic layer deposition, an approximately single layer of precursor molecules are adsorbed on a surface. A second reactant is dosed onto the first precursor layer followed by a reaction between the second reactant and the first reactant already on the surface. This alternating procedure is repeated to provide the desired thickness of element or compound in a near atomic thickness layer. The substrate temperature can be controlled to avoid undesired deposition. In spin coating, a liquid media is dispensed onto a spinning substrate and allowed to dry by the action of heat or reaction, etc. In spray pyrolysis, mist droplets (aerosol) are formed followed by thermal or photolytical decomposition of the precursor. In sol-gel processes, hydrolysis and condensation of precursors is performed where the precursors are deposited on the target substrate by spinning, dipping or spraying. In CVD using DLI, the solventless mixture is delivered from storage at ambient conditions in a liquid state to a flash vaporization zone, where the solventless mixture is quickly heated to the metal-ligand complex precursors' vaporization temperature, typically 100° C. to 500° C.

Deposition conditions will vary depending on the precursors to be reacted, the metals to be deposited and the substrate which is the target of the deposition. The appropriate deposition conditions of elevated temperature are preferably in the range of approximately 150–600° C. More preferably, the appropriate deposition conditions of elevated temperature are approximately 200–500° C. The deposition conditions also are preferably conducted at a deposition zone pressure in the range of approximately 0.01–50 Torr., more preferably, approximately 0.1–5 Torr. These constitute the respective deposition conditions for the various deposition processes occurring in a deposition zone, such as a reaction chamber.

The multi-component precursors are selected from the group consisting of, but not limited to, metal alkyls, metal alkoxides, metal halides, metal hydrides, metal amides, metal imides, metal azides, metal nitrates, metal cyclopentadienyls, metal carbonyls, metal pyrazoles, and their fluorine, oxygen and nitrogen substituted analogs. Preferably, the ligand of the solventless mixture of at least two metal-ligand complex precursors is selected from the group consisting of dimethyl amido, diethyl amido, ethylmethyl amido, butyl amido, dipropyl amido, methylpropyl amido, ethylpropyl amido, methoxy, ethoxy, propoxy, and butoxy. It is important to use the same or common ligands, homoleptic ligands, to avoid potential ligand exchange problems of the prior art. Preferably, the homoleptic ligands are monodentate.

The metal of the metal ligand precursor can be one or more of: zinc, cadmium, mercury, aluminum, germanium, gallium, indium, thallium, tin, lead, antimony, bismuth, lithium, sodium, potassium, rubidium, cesium, beryllium, magnesium, calcium, strontium, barium, scandium, yttrium, lanthanum, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, silicon and cerium.

The ambient conditions at which the solventless mixture of two or more metal ligand precursors must be liquid are defined as generally less than or equal to 200° C., preferably less than or equal to 40° C. and less than 30 psig. Preferably, the ambient conditions for liquid phase delivery are 20–30° C. and 5–6 psig.

The solventless liquid mixture is introduced into the deposition zone and vaporized preferably at a temperature in the range of approximately 50–200° C. More preferably, temperature is approximately 80–120° C.

Appropriate choice of precursors, in the presence of oxidant or nitrogen containing reactant, would provide either mixed metal oxides, nitrides, and oxynitrides. In addition, using proper precursor mixtures and CVD conditions, it is also possible to grow mixed metal alloys, carbides, carbonitrides, oxycarbides, oxycarbonitrides, borides, sulfides, phosphides, arsenides, antimonides, selenides, tellurides, and mixtures thereof. The oxidant or nitrogen containing reactant includes but is not limited to: oxygen, ozone, water, hydrogen peroxide, nitrous oxide, nitric oxide, nitrogen dioxide, air, nitrogen gas, ammonia, hydrazine, alkylhydrazine, alkylamines and mixtures thereof.

In addition to thermal CVD, the above precursors could be used for plasma, laser radical, or photo enhanced CVD deposition, a well recognized deposition technique, or by atomic layer deposition. Furthermore, appropriate choice of liquid mixture precursors may also be applied to sol-gel processing, spray pyrolysis and spin coating of films.

Exemplary solventless mixtures of at least two metal-ligand complex precursors comprises $Zr(N(CH_2CH_3)_2)_4$, $Sn(N(CH_2CH_3)_2)_4$ and $Ti(N(CH_2CH_3)_2)_4$; or $Zr(N(C_3)_2)_4$, $Sn(N(CH_3)_2)_4$ and $Ti(N(CH_3)_2)_4$; or $Zr(O(C_4H9))_4$, $Sn(O(C_4H_9))_4$ and $Ti(O(C_4H_9))_4$; or $Ta(N(CH_3)_2)_5$ and $Ti(N(CH_3)_2)_4$; or $CH_3CH_2N=Ta(N(CH_2CH_3)_2)_3$ and $Ti)N(CH_2CH_3)_2)_4$; or $Al(OCH_2CH_3)_3$ and $Ta(OCH_2CH_3)_5$; or $Si(N(CH_2CH_3)_2)$ and a metal-ligand complex precursor selected from the group consisting of $Ti(N(CH_2CH_3)_2)_4$, $Zr(N(CH_2CH_3)_2)_4$, $Hf(N(CH_2CH_3)_2)_4$, $V(N(CH_2CH_3)_2)_5$, $V(N(CH_2CH_3)_2)_4$, $Nb(N(CH_2CH_3)_2)_5$, $Nb(N(CH_2CH_3)_2)_4$, $CH_3CH_2N=Nb(N(CH_2CH_3)_2)_3$, $CH_3CH_2N=V(N(CH_2CH_3)_2)_3$, $(CH_3CH_2N=)_2W(N(CH_2CH_3)_2)_2$, $(CH_3CH_2N=)_2Mo(N(CH_2CH_3)_2)_2$, and $CH_3CH_2N=Ta(N(CH_2CH_3)_2)_3$.

The present invention will not be illustrated with several nonlimiting examples of precursors and depositions.

EXAMPLE 1

Zr—Sn—Ti—Ox Precursor $Zr(N(CH_2CH_3)_2)_4$ 19.0 g (0.05 mol), $Sn(N(CH_2CH_3)_2)_4$ 20.4 g (0.05 mol), and $Ti(N(CH_2CH_3)_2)_4$ 50.5 g (0.15 mol) were mixed at room temperature under inert atmosphere to provide a yellow-orange transparent liquid mixture. This mixture was distilled under vacuum at the heating bath temperature range of 110–120° C., which indicates the utility for DLI delivery.

EXAMPLE 2

Ti—Ta—$O_x$

A solventless liquid mixture of metal-ligand complex precursors for Ti—Ta—$O_x$ can be formed from $Ta(N(CH_3)_2)_5$ (solid) dissolved in $Ti(N(CH_3)_2)_5$ (liquid) in the same manner as in Example 1.

EXAMPLE 3

Ti—Ta—$O_x$

A solventless liquid mixture of metal-ligand complex precursors for Ti—Ta—$O_x$ can be formed from $CH_3CH_2N=Ta(N(CH_2CH_3)_2)_3$ mixed in $Ti(N(CH_2CH_3)_2)_4$ in the same manner as in Example 1.

EXAMPLE 4

Al Doped $TaO_x$

A solventless liquid mixture of metal-ligand complex precursors for Al doped $TaO_x$ can be formed from the mixture of $Al(OCH_2CH_3)_3$ (solid) and $Ta(OCH_2CH_3)_5$ (liquid) in the same manner as in Example 1.

EXAMPLE 5

M—Si—N and M—Si—O

A solventless liquid mixture of metal-ligand complex precursors for M—Si—N can be formed in the same manner as in Example 1 from the mixtures of (a) $Si(N(CH_2CH_3)_2)_4$ (liquid) and (b) $M(N(CH_2CH_3)_2)_x$ where M=Ti, Zr, Hf, V, Nb and x=4 or 5, or (c) $(R-N=)_xM'(N(CH_2CH_3)_2)_y$ where M'=Ta, Nb, W, Mo, R=$C_{1-5}$ alkyl, x=1 and y=3 for M=Ta or Nb, x=y=2 for M'=W or Mo (all liquids).

EXAMPLE 6

Mixed Metal Compound Deposition by CVD

A solventless mixture $Zr(N(CH_2CH_3)_2)_4$, $Sn(N(CH_2CH_3)_2)_4$, and $Ti(N(CH_2CH_3)_2)_4$ metal-ligand complex precursors was delivered at 0.06 ml per minute to a direct liquid injection system with a vaporization temperature of 110° C. using a helium sweep gas of 120 sccm with an oxygen flow of 100 sccm, onto a wafer substrate target for mixed metal compound film deposition where the wafer was held at 240–300° C. The deposition was from 100 to 300 angstroms per minute. The reactor chamber pressure was 2 Torr. Energy dispersive X-ray analysis of the films deposited from the precursor mixture under these conditions by CVD demonstrated that Zr, Sn and Ti metals were incorporated in the deposited films.

EXAMPLE 7

CVD of Ti—Ta—O Thin Films from $Ti(NEt_2)_4$ and t-BuN=$Ta(NEt_2)_3$

A solventless mixture of t-BuN=$Ta[N(CH_2CH_3)_2]_3$ and $Ti[N(CH_2CH_3)_2]_4$, (molar ratio Ta:Ti=92:8) metal-ligand complex precursors was delivered at 0.09 ml per minute to a direct liquid injection system with a vaporization temperature of 90° C. using a helium sweep gas of 100 sccm with a variable oxygen flow, onto a wafer substrate target for mixed metal compound film deposition where the wafer was held between 260 and 300° C. The reactor chamber pressure was 1 Torr. The deposition rate ranged from 90 to 400 angstroms per minute on bare silicon with oxygen flows of 140 sccm. The activation energy of the deposition was 21 kcal/mol. Energy dispersive X-ray (EDX) analysis of the films deposited from the precursor mixture under these CVD conditions demonstrated that Ta and Ti metals were incorporated in the deposited films. The capacitance-voltage measurement of the as-deposited films demonstrated that the dielectric constants of the films are of the order of 20. (t-Bu=tertiary butyl)

EXAMPLE 8

CVD of Ti—Ta—N Thin Films from $Ti(NEt_2)_4$ and t-BuN=$Ta(NEt_2)_3$

A solventless mixture of t-BuN=$Ta[N(CH_2CH_3)_2]_3$ and $Ti[N(CH_2CH_3)_2]_4$, (molar ratio Ta:Ti=92:8) metal-ligand complex precursors was delivered at 0.09 ml per minute to a direct liquid injection system with a vaporization temperature of 90° C. using a helium sweep gas of 100 sccm with an ammonia flow of 200 sccm, onto a wafer substrate target for mixed metal compound film deposition where the wafer was held between 230 and 295° C. The reactor chamber pressure was 1 Torr. The deposition rate ranged from 300 to 1700 angstroms per minute on bare silicon. The activation energy of the deposition was 14 kcal/mol. Energy dispersive X-ray (EDX) analysis of the films deposited from the precursor mixture under these conditions by CVD demonstrated that Ta and Ti metals were incorporated in the deposited films.

EXAMPLE 9

CVD of Zr—Ta—O Thin Films from $Zr(NEt_2)_4$ and $t-BuN=Ta(NEt_2)_3$

A solventless mixture of $t-BuN=Ta[N(CH_2CH_3)_2]_3$ and $Zr[N(CH_2CH_3)_2]_4$, (molar ratio Ta:Zr=3:1) metal-ligand complex precursors was delivered at 0.08 ml per minute to a direct liquid injection system with a vaporization temperature of 90° C. using a helium sweep gas of 100 sccm with variable oxygen flows, onto a wafer substrate target for mixed metal compound film deposition where the wafer was held between 250 and 360° C. The reactor chamber pressure was 1 Torr. The average deposition rate ranged from 80 to 360 angstroms per minute on bare silicon for 140 sccm oxygen flows. The activation energy of the deposition was 22 kcal/mol. Energy dispersive X-ray (EDX) analysis of the films deposited from the precursor mixture under these conditions by CVD demonstrated that Ta and Zr metals were incorporated in the deposited films. The capacitance-voltage measurement of the as deposited films demonstrated that the relative dielectric constants of the films are of the order of 20.

EXAMPLE 10

CVD of Zr—Ta—N Thin Films from $Zr(NEt_2)_4$ and $t-BuN=Ta(NEt_2)_3$

A solventless mixture of $t-BuN=Ta[N(CH_2CH_3)_2]_3$ and $Zr[N(CH_2CH_3)_2]_4$, (molar ratio Ta:Zr=3:1) metal-ligand complex precursors was delivered at 0.08 ml per minute to a direct liquid injection system with a vaporization temperature of 90° C. using a helium sweep gas of 100 sccm with variable ammonia flows, onto a wafer substrate target for mixed metal compound film deposition where the wafer was held between 220 and 285° C. The reactor chamber pressure was 1 Torr. The deposition rate ranged from 180 to 700 angstroms per minute on bare silicon for ammonia flows of 200 sccm. The activation energy of the deposition was 12 kcal/mol. Energy dispersive X-ray (EDX) analysis of the films deposited from the precursor mixture under these conditions by CVD demonstrated that Ta and Zr metals were incorporated in the deposited films.

EXAMPLE 11

CVD of Ta—Al—O Thin Films from $Ta(OEt)_5$ and $Al(OEt)_3$

A solventless mixture of $Ta(OCH_2CH_3)_5$ and $Al(OCH_2CH_3)_3$ (molar ratio Ta:Al=9:1) metal-ligand complex precursors was delivered at 0.07 ml per minute to a direct liquid injection system with a vaporization temperature of 120° C. using a helium sweep gas of 200 sccm with a variable oxygen flow onto a wafer substrate target for mixed metal compound film deposition where the wafer was held between 325 and 380° C. The reactor chamber pressure was 1 Torr. The deposition rate ranged from 60 to 800 angstroms per minute on bare silicon for oxygen flows of 150 sccm. The activation energy of the deposition was 31 kcal/mol. Energy dispersive X-ray (EDX) analysis of the films deposited from the precursor mixture under these conditions by CVD demonstrated that Ta and Al metals were incorporated in the deposited films. The capacitance-voltage measurement of the films demonstrated that the relative dielectric constants of the films were in the range of 20.

Previous attempts to provide appropriate liquid media for metal precursor delivery have required the use of selected solvents or mixed β-diketonate ligands to assure liquid conditions for delivery. Solvents constitute an additional expense and cause problems of appropriate selection for compatibility, as well as problems of contamination and post-use abatement. Non-solvent attempts to solve the goal of liquid phase delivery involved mixed β-diketonate ligands, but these constitute problems of inadvertent ligand exchange which can lead to non-liquid conditions. The β-diketonate ligands frequently lead to solid metal compounds, absent manipulation of the β-diketonate substituents to avoid conditions leading to solid conditions, thus aggravating the consequences of inadvertant ligand exchange. The present invention has been shown to overcome these drawbacks by using a solventless, non-β-diketonate, singular or common ligand in a metal-ligand complex of a mixture of metals in a liquid state for deposition preferably by direct liquid injection to avoid solvent and β-diketonate ligand exchange drawbacks for consistent deposition performance.

The present invention has been set forth with regard to several preferred embodiments, however, the full scope of the present invention should be ascertained from the claims which follow.

What is claimed is:

1. A process for deposition of a multiple metal or multiple metal compound layer on a substrate of an electronic material, comprising:
   a) providing a solventless mixture of two or more metal-ligand complex precursors which constitute a liquid at ambient conditions, wherein all said ligands of said solventless mixture are the same and are selected from the group consisting of alkyls, alkoxides, halides, hydrides, amides, imides, azides, nitrates, cyclopentadienyls, carbonyls, pyrazoles, and their fluorine, oxygen and/or nitrogen substituted analogs;
   b) delivering said solventless mixture by direct liquid injection to a flash vaporization zone to vaporize said solventless mixture;
   c) contacting said substrate under deposition conditions with a resulting vapor of said solventless mixture, and
   d) depositing a multiple metal or metal compound layer on said substrate from said solventless mixture, wherein said solventless mixture is mixed with a source of oxygen prior to depositing said multiple metal compound layer on said substrate.

2. The process of claim 1 wherein said ambient conditions are less than or equal to 200° C. and less than or equal to 30 psig.

3. The process of claim 1 wherein said ambient conditions are 20–30° C. and less than or equal to 5–6 psig.

4. The process of claim 1 wherein said source of oxygen is selected from the group consisting of oxygen, ozone, nitrous oxide, nitric oxide, nitrogen dioxide, water, hydrogen peroxide, air and mixtures thereof.

5. The process of claim 1 wherein said multiple metal or metal compound layer is selected from the group consisting of mixed metal alloys, mixed metal oxides, mixed metal nitrides, mixed metal carbides, mixed metal carbonitrides, mixed metal oxycarbonitrides, mixed metal oxycarbides, mixed metal oxynitrides, mixed metal borides, mixed metal sulfides, mixed metal phosphides, mixed metal arsenides, mixed metal antimonides, mixed metal selenides, mixed metal tellurides and mixtures thereof.

6. The process of claim 1 wherein said deposition conditions are elevated temperature of approximately 150–600° C.

7. The process of claim 6 wherein said appropriate reaction conditions of elevated temperature are approximately 200–500° C.

8. The process of claim 1 wherein said solventless liquid mixture is introduced into said flash vaporization zone and vaporized at a temperature of approximately 50–200° C.

9. The process of claim 8 wherein said temperature is approximately 80–120° C.

10. The process of claim 1 wherein said deposition conditions have a flash vaporization zone pressure of approximately 0.01–50 Torr.

11. The process of claim 10 wherein said pressure is approximately 0.1–5 Torr.

12. A process for deposition of a multiple metal or multiple metal compound layer on a substrate of an electronic material, comprising:
   a) providing a solventless mixture of two or more metal-ligand complex precursors which constitute a liquid at ambient conditions, wherein all said ligands of said solventless mixture are the same and are selected from the group consisting of alkyls, alkoxides, halides, hydrides, amides, imides, azides, nitrates, cyclopentadienyls, carbonyls, pyrazoles, and their fluorine, oxygen and/or nitrogen substituted analogs;
   b) delivering said solventless mixture by direct liquid injection to a flash vaporization zone to vaporize said solventless mixture;
   c) contacting said substrate under deposition conditions with a resulting vapor of said solventless mixture, and
   d) depositing a multiple metal or metal compound layer on said substrate from said solventless mixture, wherein said solventless mixture is mixed with a source of nitrogen prior to depositing said multiple metal compound layer on said substrate.

13. The process of claim 12 wherein said source of nitrogen is selected from the group consisting of nitrogen, ammonia, hydrazine, alkylhydrazine, hydrogen azide, alkylamine and mixtures thereof.

14. The process of claim 12 wherein said ambient conditions are less than or equal to 200° C. and less than or equal to 30 psig.

15. The process of claim 12 wherein said ambient conditions are 20–30° C. and less than or equal to 5–6 psig.

16. The process of claim 12 wherein said multiple metal or metal compound layer is selected from the group consisting of mixed metal alloys, mixed metal oxides, mixed metal nitrides, mixed metal carbides, mixed metal carbonitrides, mixed metal oxycarbonitrides, mixed metal oxycarbides, mixed metal oxynitrides, mixed metal borides, mixed metal sulfides, mixed metal phosphides, mixed metal arsenides, mixed metal antimonides, mixed metal selenides, mixed metal tellurides and mixtures thereof.

17. The process of claim 12 wherein said deposition conditions are elevated temperature of approximately 150–600° C.

18. The process of claim 17 wherein said deposition conditions are elevated temperature of approximately 200–500° C.

19. The process of claim 12 wherein said solventless liquid mixture is introduced into said flash vaporization zone and vaporized at a temperature of approximately 50–200° C.

20. The process of claim 19 wherein said temperature is approximately 80–120° C.

21. The process of claim 12 wherein said deposition conditions have a flash vaporization zone pressure of approximately 0.01–50 Torr.

22. The process of claim 21 wherein said pressure is approximately 0.1–5 Torr.

23. A process for deposition of a multiple metal or multiple metal compound layer on a substrate of an electronic material, comprising:
   a) providing a solventless mixture of two or more metal-ligand complex precursors which constitute a liquid at ambient conditions, wherein all said ligands of said solventless mixture are the same and are selected from the group consisting of alkyls, alkoxides, halides, hydrides, amides, imides, azides, nitrates, cyclopentadienyls, carbonyls, pyrazoles, and their fluorine, oxygen and/or nitrogen substituted analogs;
   b) delivering said solventless mixture to a deposition zone where said substrate is located;
   c) contacting said substrate under deposition conditions with said solventless mixture, where said contacting said substrate under deposition conditions is selected from the group consisting of chemical vapor deposition, spray pyrolysis, sol-gel processing, spin coating, atomic layer deposition and jet vapor deposition; and,
   d) depositing a multiple metal or metal compound layer on said substrate from said solventless mixture, wherein said solventless mixture is mixed with a source of oxygen and a source of nitrogen prior to depositing said multiple metal compound layer on said substrate to form a multiple metal oxynitride compound layer.

* * * * *